(12) United States Patent
Kishimoto

(10) Patent No.: US 11,011,593 B2
(45) Date of Patent: *May 18, 2021

(54) ORGANIC EL DISPLAY DEVICE AND MANUFACTURING METHOD FOR ORGANIC EL DISPLAY DEVICE

(71) Applicant: SAKAI DISPLAY PRODUCTS CORPORATION, Sakai (JP)

(72) Inventor: Katsuhiko Kishimoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/625,647

(22) PCT Filed: Mar. 28, 2018

(86) PCT No.: PCT/JP2018/012907
§ 371 (c)(1),
(2) Date: Apr. 2, 2020

(87) PCT Pub. No.: WO2019/186806
PCT Pub. Date: Oct. 3, 2019

(65) Prior Publication Data
US 2020/0243629 A1 Jul. 30, 2020

(51) Int. Cl.
*H01L 27/32* (2006.01)
*G09G 3/3233* (2016.01)
*H01L 51/56* (2006.01)

(52) U.S. Cl.
CPC ....... *H01L 27/3258* (2013.01); *G09G 3/3233* (2013.01); *H01L 27/3246* (2013.01);
(Continued)

(58) Field of Classification Search
CPC .................................................. H01L 27/3258
See application file for complete search history.

(56) References Cited

U.S. PATENT DOCUMENTS

2012/0294102 A1 11/2012 Ishizu
2013/0168648 A1* 7/2013 Jeong .................. H01L 27/3246
257/40

(Continued)

FOREIGN PATENT DOCUMENTS

JP 2013-008437 A 1/2013
JP 2016-153888 A 8/2016

(Continued)

OTHER PUBLICATIONS

International Search Report of PCT/JP2018/012907.

*Primary Examiner* — Jamie C Niesz
(74) *Attorney, Agent, or Firm* — ScienBiziP, P.C.

(57) ABSTRACT

This organic EL display apparatus is equipped with a substrate that has a surface with a drive circuit being formed on the surface and comprising a thin film transistor, a planarizing layer that makes the surface of the substrate planar by covering the drive circuit, and an organic light-emitting element that is formed upon the surface of the planarizing layer and is electrically connected to the drive circuit. The planarizing layer includes a first inorganic insulating layer being deposited upon the drive circuit, an organic insulating layer being deposited upon the first inorganic insulating layer, and a second inorganic insulating layer being deposited upon the organic insulating layer. The surface of the second inorganic insulating layer that faces the opposite direction from the organic insulating layer has an arithmetic mean roughness of no more than 50 nm.

10 Claims, 6 Drawing Sheets

(52) U.S. Cl.
CPC .......... *H01L 27/3276* (2013.01); *H01L 51/56* (2013.01); *H01L 2227/323* (2013.01)

(56) References Cited

U.S. PATENT DOCUMENTS

| | | |
|---|---|---|
| 2014/0326995 A1 | 11/2014 | Ishizu |
| 2018/0040640 A1 | 2/2018 | Takahashi et al. |
| 2018/0066189 A1* | 3/2018 | Ishii ........................ C08F 20/00 |
| 2019/0157627 A1* | 5/2019 | Bae ..................... H01L 27/3258 |
| 2019/0157628 A1* | 5/2019 | Kim .................... H01L 27/3258 |
| 2019/0355760 A1 | 11/2019 | Takahashi et al. |
| 2020/0243630 A1* | 7/2020 | Kishimoto ........... G09G 3/3225 |

FOREIGN PATENT DOCUMENTS

| | | |
|---|---|---|
| JP | 2017-011173 A | 1/2017 |
| JP | 2018-025777 A | 2/2018 |

\* cited by examiner

ORGANIC EL DISPLAY DEVICE AND MANUFACTURING METHOD FOR ORGANIC EL DISPLAY DEVICE

TECHNICAL FIELD

The present invention relates to an organic-EL display apparatus and a method of manufacturing an organic-EL display apparatus.

BACKGROUND ART

An organic-EL display apparatus, application of which organic-EL display apparatus to a television is in progress in recent years, comprises an organic light-emitting element being formed for each pixel, and a drive circuit to cause the organic light-emitting element to emit light with a desired current. In an active matrix-type organic-EL display apparatus, a thin-film transistor making up the drive circuit is formed on a surface of a glass substrate for each pixel to be provided in a matrix, and an organic light-emitting element is formed on an insulating layer covering the thin-film transistor. Patent document 1 discloses forming a thin-film transistor that has a multilayer structure in order to reduce the occupied area of the thin-film transistor relative to the pixel in such an active matrix-type display.

PRIOR ART DOCUMENT

Patent Document
Patent Document 1: JP 2017-011173 A

SUMMARY OF THE INVENTION

Problem to be Solved by the Invention

In an organic-EL display apparatus, when luminance non-uniformity or color non-uniformity (below, "luminance non-uniformity and/or color non-uniformity" also collectively called "display non-uniformity") occurs for each pixel or for each arbitrary region of a display screen, for example, display quality deteriorates, causing the product value of the organic-EL display apparatus to deteriorate. Therefore, in the organic-EL display apparatus, a compensation circuit for the display non-uniformity can be added to a drive circuit, or a correction unit can be provided to correct a drive current of an organic light-emitting element for each pixel or for each given region after observing the initial display state. However, a circuit element making up the compensation circuit being provided for each pixel, for example, can have variations, or an increase in size or cost can be brought about by taking measures on the display non-uniformity.

Thus, an object of the present invention is to provide an organic-EL display apparatus having less display non-uniformity even when a compensation circuit is not provided, and a method of manufacturing an organic-EL display apparatus having such less display non-uniformity.

Means to Solve the Problem

An organic-EL display apparatus according to first embodiment of the present invention comprises: a substrate having a surface with a drive circuit being formed on the surface, the drive circuit comprising a thin-film transistor; a planarizing layer to planarize the surface of the substrate by covering the drive circuit; and an organic light-emitting element being formed on a surface of the planarizing layer and electrically connected to the drive circuit, wherein the planarizing layer comprises a first inorganic insulating layer being deposited on the drive circuit; an organic insulating layer being deposited on the first inorganic insulating layer; and a second inorganic insulating layer being deposited on the organic insulating layer, and a surface of the second inorganic insulating layer facing to an opposite orientation from the organic insulating layer has an arithmetic average roughness of 50 nm or less.

A method of manufacturing an organic-EL display apparatus according to second embodiment of the present invention comprises: forming a drive circuit on a substrate, the drive circuit comprising a thin-film transistor; forming, on a surface of the drive circuit, a first inorganic insulating layer, an organic insulating layer, and a second inorganic insulating layer; polishing a surface of the second inorganic insulating layer; forming a contact hole in the second inorganic insulating layer, the organic insulating layer, and the first inorganic insulating layer, so as to reach the drive circuit; embedding a metal at the interior of the contact hole and forming a first electrode at a given region; forming an organic light-emitting layer on the first electrode; and forming a second electrode on the organic light-emitting layer.

Effects of the Invention

The first and second embodiments of the present invention make it possible to reduce luminance non-uniformity or color non-uniformity in an organic-EL display apparatus and to appropriately manufacture an organic-EL display apparatus having such less display non-uniformity.

EMBODIMENT FOR CARRYING OUT THE INVENTION

Figure 1:
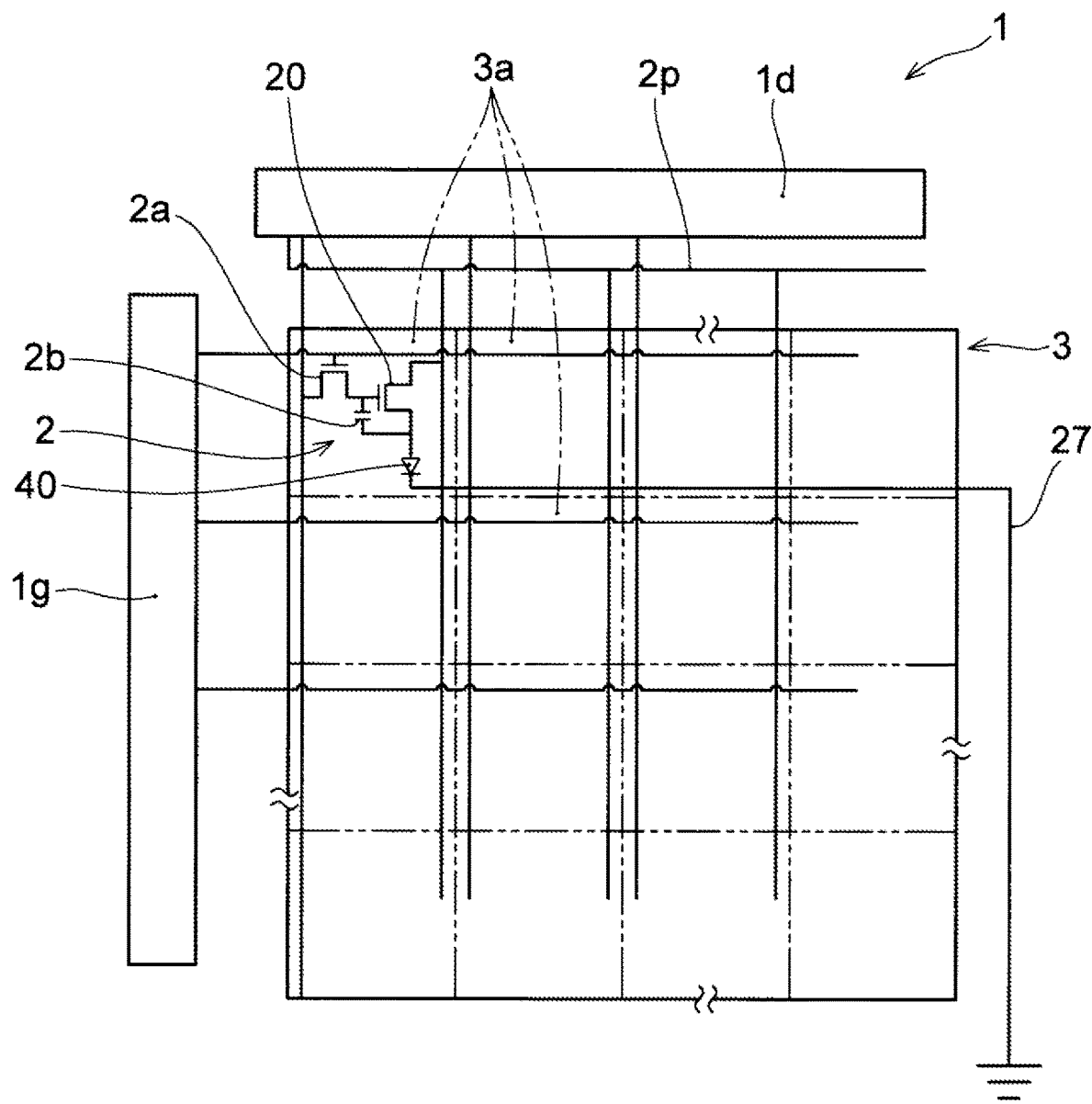
FIG. 1 schematically shows one example of a drive circuit of an organic-EL display apparatus according to one embodiment of the present invention.

The present inventor has carried out intensive studies to make investigations into causes of display non-uniformity occurring in an organic-EL display apparatus. Then, the present inventor has found that unevenness of the surface of a drive circuit comprising a thin-film transistor being formed on a surface of a substrate produces variations in layer thickness of an organic layer in an organic light-emitting element, possibly producing, as a result, luminance non-uniformity or color non-uniformity. Describing in further detail, an insulating layer is provided between the drive circuit and the organic light-emitting element as described previously, and the insulating layer makes it possible to achieve planarization of the base for the organic light-emitting element as well as blocking of moisture and electrical isolation of the drive circuit and the organic light-emitting element. However, the present inventor has found that the planarization is not necessarily sufficient from a viewpoint of obtaining an excellent display quality.

The thin-film transistor and various wirings being formed on the surface of the substrate on which the thin-film transistor is formed can produce a stepped portion, and, moreover, a stepped portion can be also produced, on a surface of each thin-film transistor, between a region on which a gate electrode, etc. is formed and the other region. A stepped portion having a height difference exceeding 300 nm, for example, can also be produced. The present inventor has found that by merely forming a planarizing layer on such a surface of the substrate as in a conventional case, the planarity of such a degree as to not produce the display non-uniformity in the organic-EL display apparatus has not been obtained. On this point, while a pixel electrode is formed over a thin-film transistor also in a liquid crystal display apparatus in the field of flat panel displays, a slight unevenness on the surface of the pixel electrode seldom makes an impact on alignment of liquid crystal molecules, so that strict planarity is not required with respect to the base for the pixel electrode. However, with the organic light-emitting element, in a case that the surface of the planarizing layer is not sufficiently planar, a variation in layer thickness of an organic layer being formed over the planarizing layer via an electrode can occur, and thereby producing luminance non-uniformity. Moreover, a direction in which an outgoing light has its peak intensity varies, or deviates from the normal direction of the display surface, due to slight inclination of the electrode surface. The present inventor has found that as a result of those, the display non-uniformity is produced.

In a top emission-type (TE-type) organic-EL display apparatus in which light of the organic light-emitting element is emitted to an orientation being opposite to the substrate, the thin-film transistor can be formed at an arbitrary region of the surface of substrate, which can even overlap in planar view with the central portion of a pixel, even at the entire light-emitting region, for example. On the other hand, in a bottom emission-type (BE-type) organic-EL display apparatus, the thin-film transistor is formed at the vicinity of an edge portion of the pixel so as to prevent light of the organic light-emitting element from being blocked as much as possible. However, in not only the TE-type but also the BE-type, it was found that the unevenness of the surface of the substrate due to the thin-film transistor appears as ups and downs even on the surface of the planarizing layer at a region overlapping with the light-emitting region of the pixel, and such minute ups and downs cause display non-uniformity. Then, the present inventor has found that occurrence of the luminance non-uniformity and the color non-uniformity can be suppressed by achieving further planarizing of the surface of the planarizing layer to be the base for the organic light-emitting element.

Below, an organic-EL display apparatus and a method of manufacturing an organic-EL display apparatus according to embodiments of the present invention are described with reference to the drawings. Material and shape of individual constituting elements, and relative positional relationship thereof in the embodiments to be described below are merely exemplary. The organic-EL display apparatus and the method of manufacturing an organic-EL display apparatus according to the present invention are construed to be not limited thereto.

(Organic-EL Display Apparatus)

In FIG. 1, one example of a configuration of a drive circuit 2 of an organic-EL display apparatus 1 according to first embodiment is shown together with an organic-EL display panel 3, a data line driver 1d, and a scanning line driver 1g, each of which is shown schematically. The organic-EL display panel 3 comprises a plurality of pixels 3a being arranged in a matrix, and an organic light-emitting element 40 and the drive circuit 2 are provided in each of the pixels 3a. In the example in FIG. 1, each drive circuit 2 comprises a drive TFT 20 to switch the conduction state of the organic light-emitting element 40, a switching TFT 2a to switch on/off of the drive TFT 20, and a storage capacitance 2b to hold the gate-source voltage of the drive TFT 20. The drain, the source, and the gate of the drive TFT 20 are connected to a power line 2p, an anode of the organic light-emitting element 40, and the source of the switching TFT 2a, respectively, while a cathode of the organic light-emitting element 40 is connected to the ground via a cathode wiring 27.

Figure 2:
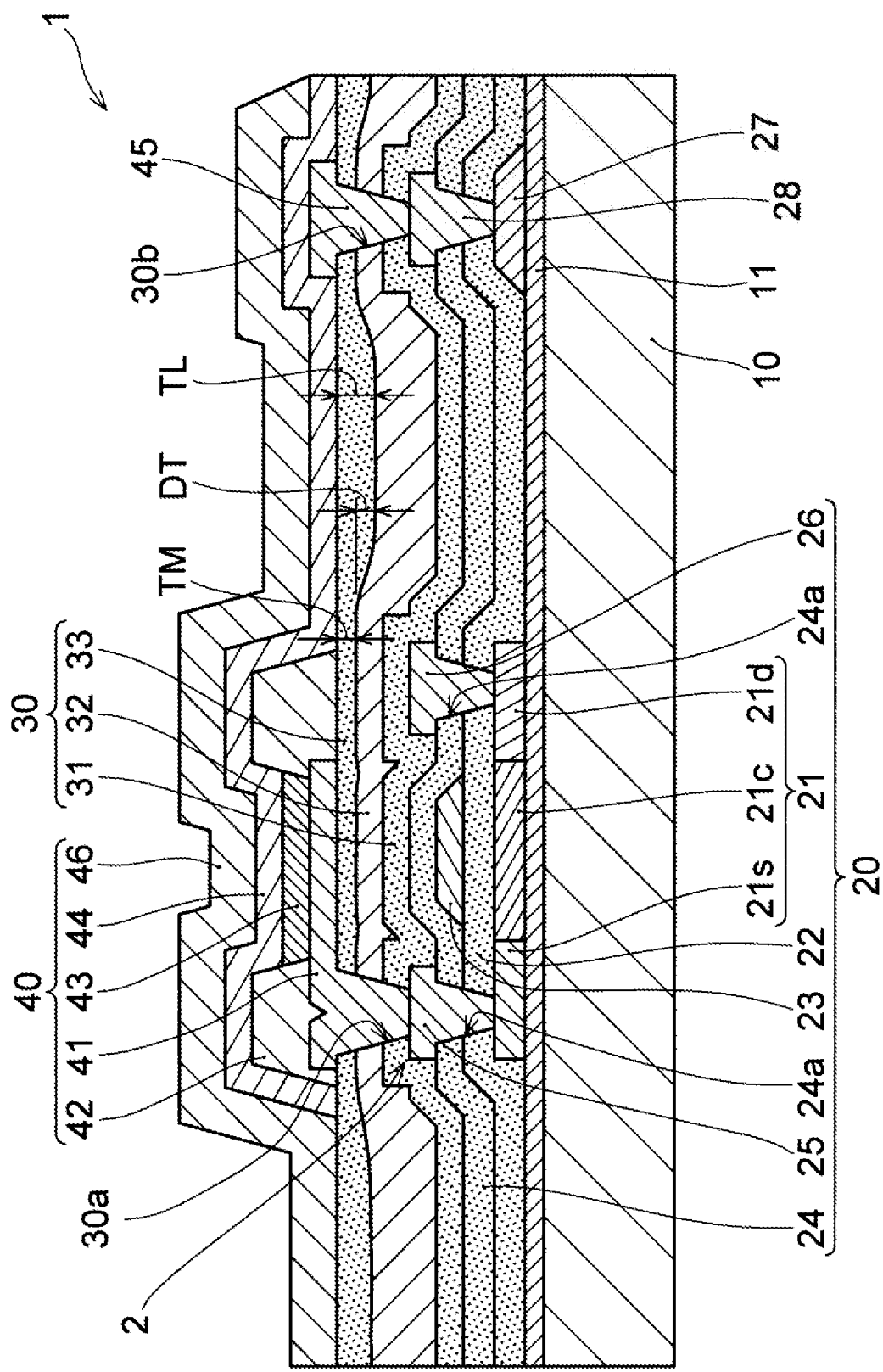
FIG. 2 schematically shows a cross sectional view of one example of an organic light-emitting element and a thin-film transistor of the organic-EL display apparatus according to one embodiment of the present invention.

A gate signal is transmitted to each switching TFT 2a from the scanning line driver 1g and also a data signal of a display image is applied to the gate of each drive TFT 20 via each switching TFT 2a from the data line driver 1d. A current based on the voltage of the data signal flows to the organic light-emitting element 40, and the organic light-emitting element 40 emits light at a given luminance during one frame period thanks to behavior of the storage capacitance 2b. Below, the structure of the organic-EL display apparatus 1 according to the present embodiment is explained with reference to FIG. 2 showing a cross section of the organic-EL display panel 3 comprising a pixel 3a. In the explanations below, the drive TFT 20 is simply called "the thin-film transistor 20 (TFT 20)". Moreover, the "pixel" being referred to in the explanations and drawings in the above and in the following is a minimum constituting element (unit element) of a display screen, to be exact, "a sub-pixel", but also called a "pixel" for brevity of explanations. Furthermore, the "surface" in the explanations in the following means a surface facing to an opposite orientation from a substrate 10 (see FIG. 2) in each constituting element constituting the organic-EL display apparatus 1 other than the substrate 10 in a case that no distinction thereof is particularly recited. Moreover, the "surface" with respect to the substrate 10 means a surface facing to the organic light-emitting element 40 in a case that no distinction thereof is particularly recited.

FIG. 2 shows a cross section of the organic-EL display panel 3 in an enlarged manner, wherein, particularly, one example of a cross section of the TFT 20 and the organic light-emitting element 40 is shown together with cathode contacts (a first contact 28 and a second contact 45) of the organic light-emitting element 40. As shown in FIG. 2, the organic-EL display apparatus 1 according to the present embodiment comprises a substrate 10 having a surface on which the drive circuit 2 comprising the thin-film transistor 20 has been formed; a planarizing layer 30 to planarize the surface of the substrate 10 by covering the drive circuit 2; and the organic light-emitting element 40 being formed on a surface of the planarizing layer 30 and electrically connected to the drive circuit 2. In the example in FIG. 2, the TFT 20 is an N-channel field-effect transistor, and comprises a semiconductor layer 21 comprising a channel $21c$, a gate electrode 23 being formed over the channel $21c$ via an gate insulating layer 22, and a source electrode 25 and a drain electrode 26 being connected to a source $21s$ and a drain $21d$, respectively, of the semiconductor layer 21. The source electrode 25 and the drain electrode 26 are insulated from the gate electrode 23 by an interlayer insulating layer 24. The organic light-emitting element 40 is a top emission-type (TE-type) organic light-emitting diode (OLED) in the example in FIG. 2, and comprises a first electrode (for example, an anode) 41 being formed on the planarizing layer 30, an insulating bank 42 surrounding the first electrode 41, an organic light-emitting layer 43 being formed and being surrounded by the insulating bank 42, and a second electrode (for example, a cathode) 44 being formed over the entire substrate 10, such as on the organic light-emitting layer 43. The planarizing layer 30 comprises a first inorganic insulating layer 31 being deposited on the drive circuit 2; an organic insulating layer 32 being deposited on the first inorganic insulating layer 31; and a second inorganic insulating layer 33 being deposited on the organic insulating layer 32. Then, a surface of the second inorganic insulating layer 33 facing to an opposite orientation from the organic insulating layer 32 has an arithmetic average roughness of 50 nm or less. Moreover, in the example in FIG. 2, the organic light-emitting element 43 being demarcated by the insulating bank 42 is formed in a region not overlapping in planar view with the contact hole $30a$ that electrically connects the source electrode 25 and the first electrode 41 to each other.

In other words, in the organic-EL display apparatus 1 according to the present embodiment, the surface of the substrate 10 having unevenness due to forming of the drive circuit 2 is covered with the planarizing layer 30 having a deposition structure including the first inorganic insulating layer 31, the organic insulating layer 32, and the second inorganic insulating layer 33, and the surface of the planarizing layer 30 is brought to the arithmetic average roughness (Ra) of 50 nm or less. For example, the surface of the planarizing layer 30 can be brought to the arithmetic average roughness of 50 nm or less by performing of polishing after depositing of each insulating layer. Moreover, in the example in FIG. 2, the organic light-emitting layer 43 is formed in a region not overlapping in planar view with a contact hole $30a$.

As described previously, as a result of the present inventor having made intensive studies on the cause that display non-uniformity is produced in the organic-EL display apparatus, it was found that the surface of the organic light-emitting layer in the organic light-emitting element is not a completely planar surface, but comprises a minute unevenness, having a microscopically inclined portion. The surface of the organic light-emitting layer being inclined causes the normal direction of the surface of the organic light-emitting layer to incline relative to the normal direction of the display surface of the organic-EL display apparatus. In such a case, it becomes difficult to recognize a light emitted in the slanted direction from such an organic light-emitting layer from the front of the display surface. Therefore, deterioration in luminance, or variation in chromaticity determined by the intensity of light of each color of R, G, and B occurred.

Conventionally, characteristic variations in the organic light-emitting element (OLED) and the TFT making up the drive circuit were questioned as the cause of display non-uniformity and measures for these variations were taken. For example, a circuit was added to each drive circuit provided for each pixel to compensate for the characteristic variations of the TFT and/or the OLED. However, with such measures, the number of constituting elements of the drive circuit can increase, causing the cost and size thereof to increase, or can cause the further necessity of an additional circuit in order to suppress variations in the compensation circuit itself. In the first place, these measures did not effectively function as measures for the display non-uniformity found by the present inventor, but rather could increase unevenness of the surface of the substrate with an increase in the number of constituting elements of the drive circuit. Moreover, luminance distribution of the screen could be grasped by the inspection process of the organic-EL display apparatus and currents to pass through individual organic light-emitting elements could be controlled based on correction data for uniformizing the luminance distribution. However, these measures required complication of the manufacturing process of the organic-EL display apparatus and complicated control.

On the other hand, in the present embodiment, as described previously, in order to eliminate the newly found cause of display non-uniformity, or, in other words, in order to improve the planarity of the surface of the organic light-emitting layer 43, the surface of the planarizing layer 30 to be a base for the organic light-emitting layer 43 is brought to the arithmetic average roughness of 50 nm or less. In this way, a display image having an extremely small luminance non-uniformity and color non-uniformity can be obtained. Moreover, the thickness of the organic light-emitting layer 43 stabilizes, making it possible to stably obtain advantageous effects by adopting the micro-cavity structure being effective in improving the purity of each color of R, G, and B and the intensity of an outgoing light. Therefore, for each pixel (sub-pixel) of the organic-EL display apparatus 1 according to the present embodiment, it is preferable to adopt the microcavity structure. Moreover, in the example in FIG. 2, the organic light-emitting layer 43 is formed at a region not overlapping in planar view with the contact hole $30a$ to avoid the position directly above the contact hole $30a$. Therefore, as described below, the display non-uniformity caused by the contact hole $30a$ is also unlikely to be produced.

While the surface roughness of the planarizing layer 30 being smaller is more preferable, the arithmetic average roughness being such as to be set as a target in the polishing process of interlayer insulating layer in the semiconductor device manufacturing process, for example, to be less than 20 nm, is not necessarily required. The strict planarity in such a polishing process of the semiconductor device is required to deal with a shallow focal depth of a light source to be used in exposure in the subsequent photolithography process, so that it is required for an object being completely different from suppressing the display non-uniformity of the organic-EL display apparatus. In other words, the present inventor has found that, from a viewpoint of suppressing the display non-uniformity of the organic-EL display apparatus 1, it suffices that the surface of the planarizing layer 30 has the arithmetic average roughness of 50 nm or less, in which case the display non-uniformity such as to be detected by a human being is seldom produced. Moreover, it has been found that, even when varieties of screen size and resolution, and manufacturing variations in the organic light-emitting element 40 are taken into account, the surface roughness of less than 20 nm is not necessary, and, if anything, the arithmetic average roughness of no less than 20 nm is preferable from the aspect of the ease of implementation. In other words, in view of coping with both easy manufacture and effective suppression of the display non-uniformity that can influence the display quality, it is preferable that the surface of the planarizing layer 30, or, more specifically, the surface of the second inorganic insulating layer 33 facing to an opposite orientation from the organic insulating layer 32 have an arithmetic average roughness of 20 nm or more and 50 nm or less.

Each constituting element of the organic-EL display apparatus 1 will further be described with reference to FIG. 2. For the substrate 10, a glass substrate or a polyimide film is mainly used. In a case that the organic-EL display apparatus 1 is of a bottom emission-type (BE-type) unlike the example in FIG. 2, a light-transmitting material, or, in other words, a glass substrate, a transparent polyimide film, or the like can be used. The use of a resin film makes it possible to easily make the organic-EL display apparatus 1 flexible and to bond it to a curved surface.

A base coat layer 11 is formed as a barrier layer on the surface of the substrate 10 on which the TFT 20 is formed. For example, using plasma CVD, a base coat layer 11 is formed having an underlayer mainly comprising an $SiO_2$ layer having a thickness of approximately 500 nm and an $SiN_X$ layer having a thickness of approximately 50 nm, and an overlayer mainly comprising an $SiO_2$ layer having a thickness of approximately 250 nm.

The drive circuit 2 comprising the TFT 20 is formed over the base coat layer 11. The cathode wiring 27 is also formed over the base coat layer 11. While being omitted in FIG. 2, wirings for scanning lines and data lines are also formed in the same manner as the cathode wiring 27. Moreover, while only the TFT 20 to drive the light-emitting element 40 is shown in FIG. 2, the previously-described switching TFT 2a is also formed on the base coat layer 11, and other TFTs can also be formed thereon. In a case that the organic-EL display apparatus 1 is of the TE-type as the example in FIG. 2, the drive circuit 2 can be formed across the entire surface below a light-emitting region of the organic light-emitting element 40. On the other hand, with the BE-type, the TFT 20 cannot be formed below the light-emitting region of the organic light-emitting element 40, so that the TFT 20 is formed at the peripheral edge of a portion overlapping in planar view with the light-emitting region. However, even in this case, an inclined surface is produced at a portion bordering a portion under the light-emitting region at which a TFT is not formed and a portion in the peripheral edge at which each wiring or the TFT 20 is formed. Thus, unevenness is produced at the peripheral edge of the light-emitting region, causing the display quality to deteriorate as described previously. Therefore, with not only the TE-type but also the BE-type, the planarizing layer 30 is required, which fills such unevenness and has, at the surface thereof, the planarity of such a degree as to not produce the display non-uniformity.

The TFT 20 is formed of the semiconductor layer 21 having the source 21s, the channel 21c, and the drain 21d; the gate insulating layer 22; the gate electrode 23; the interlayer insulating layer 24; the source electrode 25; and the drain electrode 26. The gate insulating layer 22 mainly comprises $SiO_2$ of approximately 50 nm in thickness, while the gate electrode 23 is formed by patterning after forming a layer of Mo, for example, of approximately 250 nm in thickness. Over the gate electrode 23, the interlayer insulating layer 24 comprising an $SiO_2$ layer of approximately 300 nm in thickness and an $SiN_X$ layer of approximately 300 nm in thickness is formed. The source electrode 25 and the drain electrode 26 to be connected to the source 21s and the drain 21d, respectively, are formed. Before the interlayer insulating layer 24 is formed, the source 21s and the drain 21d, and the cathode wiring 27 are increased in impurities concentration by doping boron ions, for example, and electric resistance thereof is reduced with activation by annealing. More specific structure will be described in detail in the explanations of the below-described method of manufacturing an organic-EL display apparatus. While FIG. 2 shows an example of a structure of a top gate-type in which the semiconductor layer 21 is provided between the gate electrode 23 and the substrate 10, the TFT 20 provided to the organic-EL display apparatus 1 according to the present embodiment can have a structure of a bottom gate-type.

A first inorganic insulating layer 31 comprising $SiN_X$ of approximately 200 nm in thickness is formed as a barrier layer on the surface of the drive circuit 2 comprising the TFT 20, an organic insulating layer 32 is formed on the first inorganic insulating layer 31, and a second inorganic insulating layer 33 is formed thereon. In other words, the planarizing layer 30 having deposition structure of three layers comprising an inorganic layer, an organic layer, and an inorganic layer is formed. In the planarizing layer 30, the contact hole 30a is formed, which collectively penetrates the first inorganic insulating layer 31, the organic insulating layer 32, and the second inorganic insulating layer 33. As described below, a metal such as indium tin oxide (ITO), and silver (Ag) or APC (silver, copper and palladium), for example, is embedded into the contact hole 30a, and the drive circuit 2 and the organic light-emitting element 40 are connected to each other via this metal.

The organic insulating layer 32 has a thickness of approximately 1 μm or more and 2 μm or less, for example. The unevenness of the surface of the substrate 10 due to forming of the drive circuit 2 is substantially reduced by the organic insulating layer 32. The organic insulating layer 32 is formed using a polyimide resin or an acrylic resin, for example. Moreover, the organic insulating layer 32 preferably comprises an additive agent (a leveling improving agent) to improve the planarity of the surface of the organic insulating layer 32. The organic insulating layer 32 can be formed using a photosensitive resin such that the contact hole 30a can be formed by exposure using mask and development. However, a photopolymerization initiator such as Michler's ketone, Chlorothioxanthone, or Isopropylthioxanthone, for example, can reduce the effect of the previously-described leveling improving agent, or the leveling improving agent can block photopolymerization. Therefore, a material not comprising a photosensitive body such as a photopolymerization initiator is preferably used for the organic insulating layer 32. Even in that case, the contact hole 30a can be formed by dry etching as described below. Also, selecting a method not using photosensitivity for forming of the contact hole 30a in such a manner makes it possible to use an organic material being high in purity, such as an acrylic resin, as a material for the organic insulating layer 32. Moreover, an amount of leveling improving agent being necessary and sufficient for the organic insulating layer 32 can be added without any concern for the impact on photopolymerization, and/or the required amount of leveling improving agent can be reduced since the impact of the photopolymerization initiator is eliminated. Therefore, the selection range of the amount of adding the leveling improving agent is expanded. For example, the organic insulating layer 32 preferably comprises the additive agent, at the content rate of 0.5 mass % or more and 5 mass % or less, which improves the planarity of the surface of the organic insulating layer 32 facing to the second inorganic insulating layer 33. The leveling improving agent included at the amount of such a degree in the organic insulating layer 32 makes it possible to easily form the planarizing layer 30 having the surface with the arithmetic average roughness of 50 nm or less. In addition, impact on the properties required for the acrylic resin or the polyimide resin is reduced. Examples of such a leveling improving agent include silicone-based, hydrocarbon-based, and fluorine-based surfactants.

The acrylic resin fits well with the surfactant and has a high planarity, so that it is preferable as a material for the organic insulating layer 32 from a viewpoint of not only the purity thereof but also the planarity of the surface of the organic insulating layer 32. On the other hand, in a case that the manufacturing process of the organic-EL display apparatus 1 comprises a process of high temperature of 200° C. or more, a polyimide resin having a high heat resistance is preferable. Therefore, the organic insulating layer 32 is preferably an acrylic resin not comprising a photosensitive body such as a photopolymerization initiator, or a polyimide resin not comprising the photosensitive body. Moreover, the surface of the organic insulating layer 32 facing to the second inorganic insulating layer 33 preferably has the arithmetic average roughness of 100 nm or more and 300 nm or less. In that case, as described previously, the planarizing layer 30 having the surface with the arithmetic average roughness of 50 nm or less can be formed easily and, even more, the content rate of the leveling improving agent in the organic insulating layer 32 can be kept to a degree so as not to be excessive.

The second inorganic insulating layer 33 has the arithmetic average roughness of 50 nm or less at the surface facing to the opposite orientation from the organic insulating layer 32 as described previously, therefore, the display non-uniformity of the organic-EL display apparatus 1 can be suppressed. While the second inorganic insulating layer 33 is formed of $SiN_X$ or $SiO_2$, for example, $SiN_x$ is preferable in terms of barrier properties to moisture. In other words, the barrier performance to moisture of the planarizing layer 30 is improved by the second inorganic insulating layer 33.

The second inorganic insulating layer 33 can also have an effect of blocking moisture at the time of not only use of but also manufacturing of the organic-EL display apparatus 1. In other words, as described below, the surface of the planarizing layer 30 can be polished in the manufacturing process so as to have the surface roughness of 50 nm or less and cleaning can be carried out to remove the polishing agent after polishing. In a case that the second inorganic insulating layer 33 is not formed, the surface of the organic insulating layer 32 is to be polished and further to be exposed to the cleaning agent. In that case, the cleaning agent can penetrate into the organic insulating layer 32, remain as it is, and cause deterioration of the TFT 20. However, by the second inorganic insulating layer 33 being formed, such a penetration of the cleaning agent into the organic insulating layer 32 and such a deterioration of the TFT 20 can be prevented.

The second inorganic insulating layer 33 is formed so as to have the thickness of approximately 100 nm or more and 600 nm or less, for example. However, the thickness of the second inorganic insulating layer 33 relates to the magnitude of the unevenness appearing on the surface of the organic insulating layer 32. In other words, the second inorganic insulating layer 33 is formed on the surface having the unevenness of the organic insulating layer 32 and the surface of the second inorganic insulating layer 33 has the planarity of 50 nm or less in arithmetic average roughness, so that the thickness of the second inorganic insulating layer 33 varies based on the unevenness of the surface of the organic insulating layer 32 facing to the second inorganic insulating layer 33.

The second inorganic insulating layer 33 is preferably formed so as to have a thickness of equal to or more than three times a maximum height difference DT of the unevenness of the surface of the organic insulating layer 32, for example, such that the unevenness of the surface of the organic insulating layer 32 can be sufficiently embedded in the second inorganic insulating layer 33. Then, it is preferable that the surface of the second inorganic insulating layer 33 be polished, as needed, for the length (the thickness) of equal to or more than maximum height difference DT and less than two times the maximum height difference DT. In this way, without exposing the organic insulating layer 32, it is possible to trim the protrusion of the surface of the second inorganic insulating layer 33 due to the protrusion of the surface of the organic insulating layer 32 and the surface of the planarizing layer 30 can be almost certainly brought to the arithmetic average roughness of 50 nm or less. In that case, over the entirety of the surface of the organic insulating layer 32, the second inorganic insulating layer 33 can have the thickness of equal to or more than one times the maximum height difference DT and equal to or less than three times the maximum height difference DT of the unevenness of the surface of the organic insulating layer 32. For example, in FIG. 2, a maximum thickness TL of the second inorganic insulating layer 33 is equal to or more than two times the maximum height difference DT and equal to or less than three times the maximum height difference DT of the unevenness of the organic insulating layer 32, while a minimum thickness TM of the second inorganic insulating layer 33 is equal to or more than one times the maximum height difference DT and equal to or less than two times the maximum height difference DT of the unevenness of the organic insulating layer 32. In particular, in the example in FIG. 2, the maximum thickness TL of the second inorganic insulating layer 33 is substantially two times the maximum height difference DT of the unevenness of the organic insulating layer 32, while the minimum thickness TM of the second inorganic insulating layer 33 is substantially the same as the maximum height difference DT of the unevenness of the organic insulating layer 32.

The contact hole 30a collectively penetrates each insulating layer making up the planarizing layer 30 as described previously. Therefore, there is no conspicuous stepped portion at the inner wall of the contact hole 30a, therefore making it easy to embed the metal into the contact hole 30a. Moreover, a crack is difficult to be produced in the metal. In the planarizing layer 30, a contact hole 30b to form the second contact 45 of the cathode contacts is also formed, and the contact hole 30b also collectively penetrates each insulating layer making up the planarizing layer 30.

The first electrode 41 of the organic light-emitting element 40 is formed integrally with the metal being embedded into the contact hole 30a. In other words, ITO, a metal such as Ag or APC, and ITO are embedded into the contact hole 30a using sputtering, for example, and each of ITO layer, metal layer such as Ag or APC, and ITO layer which are the same as those in the contact hole 30 is also formed on the surface of the planarizing layer 30. These are patterned to a given shape, so that the first electrode 41 in which the overlayer and the underlayer are ITO layers and a metal layer such as Ag or APC is interposed between the ITO layers is formed. In relation to the organic light-emitting layer 43, the first electrode 41 preferably has a work function of approximately 5 eV, so that, in a case of the top emission-type, ITO, and Ag or APC as described previously are used. The ITO layer is formed so as to have the thickness of approximately 10 nm, while the Ag or APC layer is formed so as to have the thickness of approximately 100 nm. In a case of the bottom emission-type, only the ITO layer having the thickness of approximately 300 nm or more and 1 μm or less is formed, for example.

In a portion directly above the contact hole 30a of the surface of the first electrode 41 can be produced a hollow as shown in FIG. 2 in a case that the contact hole 30a is not completely filled with ITO. However, in the example in FIG. 2, the first electrode 41 has a region not overlapping in planar view with the contact hole 30a at a size being sufficient to form the organic light-emitting layer 43, and the organic light-emitting layer 43 is formed at the region not overlapping with the contact hole 30a. Therefore, the non-uniformity of thickness of the organic light-emitting layer 43 and the hollow at the surface thereof is unlikely to be produced, and the display non-uniformity caused by the contact hole 30a is unlikely to be produced.

An insulating bank 42 to insulate the first electrode 41 from the second electrode 44 as well as to demarcate each pixel is formed at the peripheral edge of the first electrode 41. In the example in FIG. 2, the hollow of the surface of the first electrode 41 is covered with the insulating bank 42. Then, the organic light-emitting layer 43 is deposited on the first electrode 41 being surrounded by the insulating bank 42. The organic light-emitting layer 43 to be a light-emitting region of the organic light-emitting element 40 is formed preferably at a region not overlapping in planar view with the contact hole 30a as in the example in FIG. 2. In that case, as described previously, the display non-uniformity caused by the contact hole 30a is unlikely to be produced. While the organic light-emitting layer 43 is shown as one layer in FIG. 1, it is formed as a plurality of organic layers by depositing various materials. The organic light-emitting layer 43 is formed by printing, or vapor deposition in which an organic material being evaporated or sublimed is selectively adhered onto only a required portion using a mask.

Specifically, as a layer to be in contact with the first electrode 41, for example, a positive hole injection layer is provided, which comprises a material having a high compatibility with ionization energy to improve the injectability of positive holes. A positive hole transport layer allowing trapping of electrons into the light-emitting layer (as the energy barrier) as well as improving the stable transport of positive holes is formed by an amine-based material, for example, on the positive hole injection layer. Moreover, the light-emitting layer is formed on the positive hole transport layer, which is selected in accordance with a wavelength of light to be emitted. For example, an organic luminescence material of red or green is doped to $Alq_3$ for red or green, for example. Moreover, as a blue-color material, a DSA-based organic material is used. Furthermore, on the light-emitting layer, an electron transport layer to stably transport electrons as well as to improve the injectability of electrons is formed by $Alq_3$. These individual layers, each having a thickness of approximately several tens of nm, are deposited to form a deposited organic light-emitting layer 43. An electron injection layer made of, for example, LiF or Liq to improve the injectability of electrons can be provided between the organic light-emitting layer 43 and the second electrode 44.

The second electrode 44 is formed over the organic light-emitting layer 43. In the example in FIG. 2, the second electrode 44 is continuously formed so as to be common across all the pixels, and is connected to the cathode wiring 27 via the first contact 28 formed in the gate insulating layer 22 and the interlayer insulating layer 24 and the second contact 45 formed in the planarizing layer 30. The second electrode 44 is formed by a light-transmitting material, for example, a thin-film Mg—Ag layer. For the second electrode 44, a material having a small work function is preferable, so that an alkaline metal, or an alkaline earth metal can be used. Mg (magnesium) is preferable in having a small work function of 3.6 eV, and Ag having a small work function of approximately 4.25 eV is co-vapor deposited at the ratio of approximately 10 mass % to provide stability. With the BE-type, the second electrode 44 is a reflecting plate, so that Al (aluminum) is thickly deposited as the second electrode 44.

An encapsulation layer (TFE) 46 to prevent moisture from reaching to the second electrode 44 is formed over the second electrode 44. The encapsulation layer 46, comprising an inorganic insulating layer such as $SiN_x$ or $SiO_2$, for example, is formed by forming a single-deposited film, or two or more layers of deposited film. For example, two layers of deposited film in which the thickness of each layer is approximately between 0.1 μm and 0.5 μm are formed as the encapsulation layer 46. The encapsulation layer 46 is preferably formed in a multilayer using different materials so as to obtain sufficient barrier property with respect to moisture even when a pin hole is created in one layer. The encapsulation layer 46 is formed such as to completely coat the organic light-emitting layer 43 and the second electrode 44. The encapsulation layer 46 can comprise an organic insulating layer in between two layers of inorganic insulating layer.

(Method of Manufacturing an Organic-EL Display Apparatus)

Herein below, with the organic-EL display apparatus 1 shown in FIG. 2 as an example, a method of manufacturing an organic-EL display apparatus according to one embodiment is explained with reference to a flowchart in FIG. 3 and cross-sectional views shown in FIGS. 4A to 4G.

Figure 3:
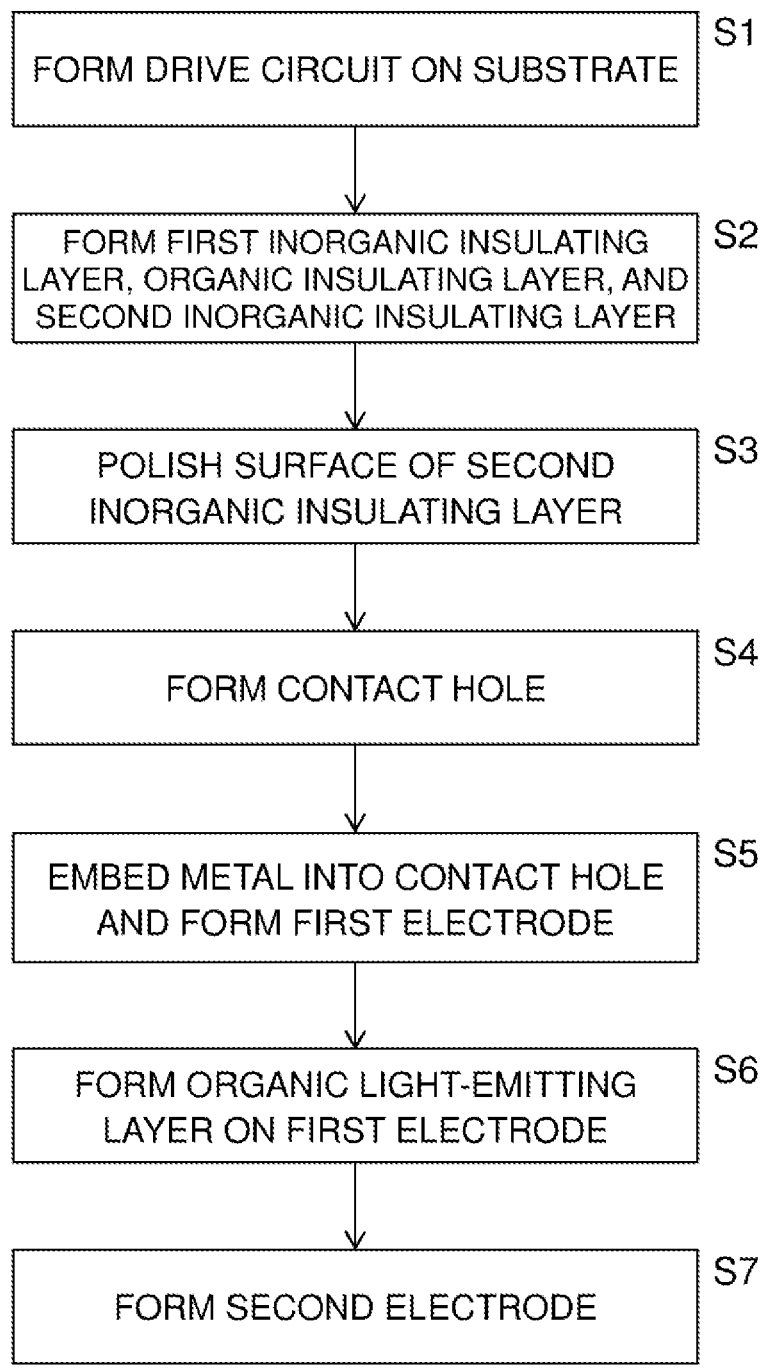
FIG. 3 shows a flowchart of a method of manufacturing an organic-EL display apparatus according to one embodiment of the present invention.
Figure 4A:
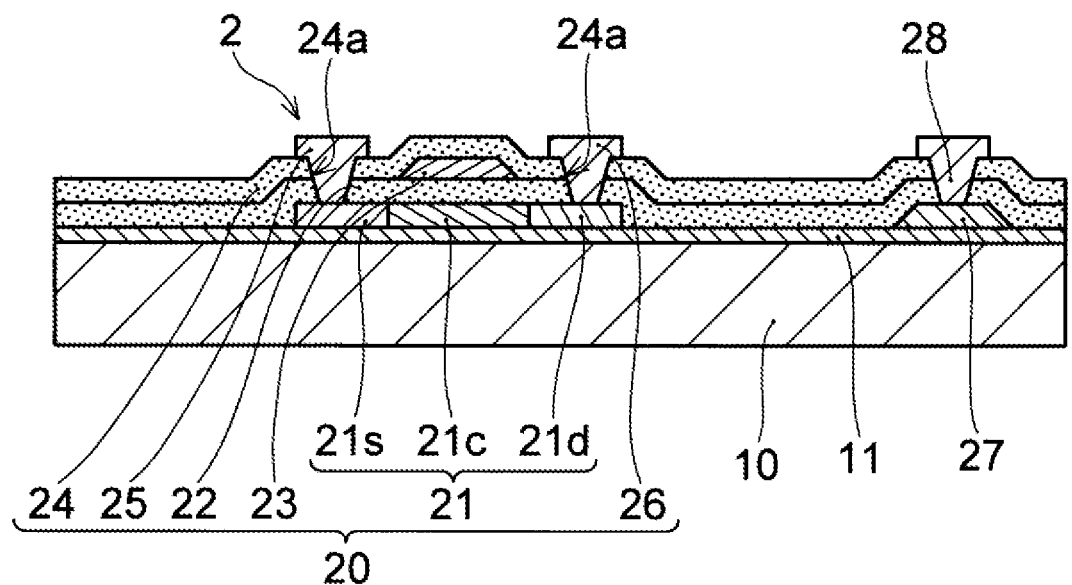
FIG. 4A schematically shows a cross sectional view of the organic-EL display apparatus in manufacturing using the method of manufacturing an organic-EL display apparatus according to one embodiment of the present invention.

As shown in FIG. 4A, a drive circuit 2 comprising a thin-film transistor 20 is formed on a substrate 10 (S1 in FIG. 3). Specifically, a base coat layer 11, for example, is formed on the surface of the substrate 10 using plasma CVD. While the base coat layer 11 is shown with a single layer structure in FIG. 4A, it is formed, for example, by depositing an $SiO_2$ layer having a thickness of approximately 500 nm, an $SiN_x$ layer having a thickness of approximately 50 nm on the $SiO_2$ layer, and further an $SiO_2$ layer having a thickness of approximately 250 nm on the $SiN_x$ layer.

Thereafter, a semiconductor layer comprising an amorphous silicon (a-Si) layer is formed across the entire surface of the base coat layer 11 using plasma CVD, for example. A dehydrogenation process is carried out for the semiconductor layer by an annealing process for approximately 45 minutes under the temperature of approximately 350° C., for example. Then, the semiconductor layer is annealed by irradiation of an excimer laser for approximately several ten nsec, so that a-Si is converted into polysilicon. The semiconductor layer being converted into polysilicon is patterned through forming a mask using photolithography and dry etching, for example. As a result, a semiconductor layer 21 having a given width and length, and a cathode wiring 27 having a given shape are formed. At this time, each wiring (not shown) other than the cathode wiring 27 such as a scanning line and a data line can also be formed as needed. Thereafter, a gate insulating layer 22 to cover the semiconductor layer 21 and the like is formed. The gate insulating layer 22 is formed by forming an $SiO_2$ layer having a thickness of approximately 50 nm using plasma CVD, for example.

A gate electrode 23 is formed by forming a Mo (molybdenum) layer using sputtering, for example, on the gate insulating layer 22 so as to have a thickness of approximately 250 nm, and patterning the Mo layer using dry etching. Then, impurity ions (for example, boron) are doped at a high concentration to the semiconductor layer 21 through the gate insulating layer 22 with the gate electrode 23 as a mask and, moreover, the doped impurity ions are activated by annealing. As a result, the resistance of a region in which the impurity ions are doped in the semiconductor layer 21 is reduced, so that a source 21s and a drain 21d consisting of the region whose resistance is reduced and a channel 21c consisting of a region directly below the gate 23 are provided. The annealing is carried out for approximately 45 minutes at the temperature of approximately 350° C., for example. At this time, the resistances of the cathode wiring 27 and each wiring formed as needed, other than the cathode wiring 27, are also reduced by the ion doping and the annealing.

Thereafter, an interlayer insulating layer 24 is formed on the entire surface of the gate insulating layer 22 and the gate electrode 23 and contact holes 24a to expose a part of the source 21s and the drain 21d are formed. The interlayer insulating layer 24 is formed by forming a deposited layer of an underlayer comprising mainly $SiO_2$ and having a thickness of approximately 300 nm, and an overlayer comprising mainly $SiN_x$ and having a thickness of approximately 300 nm, using plasma CVD, for example. The contact hole 24a is formed through forming a mask by formation of a resist film and selective exposure and development and carrying out dry etching.

Thereafter, a metal film is formed, so that a metal is embedded into the contact hole 24a and a metal layer of a source electrode 25 and a drain electrode 26 is formed on the surface of the interlayer insulating layer 24. The metal layer of the source electrode 25 and the drain electrode 26 is formed by depositing a Ti (titanium) layer having a thickness of approximately 300 nm and an Al layer having a thickness of approximately 300 nm using sputtering, for example, and further forming thereon a Ti layer having a thickness of approximately 100 nm. This metal layer is patterned using photolithography and dry etching, so that the source electrode 25 and the drain electrode 26 being connected to the source 21s and the drain 21d, respectively, of the semiconductor layer 21 are formed. A first contact 28 to be connected to the cathode wiring 27 is formed using the same method as forming the source electrode 25 and the drain electrode 26. According to the above-described process, the drive circuit 2 comprising the TFT 20, or, in other words, a portion called a backplane is formed. The above-described method of forming the drive circuit 2 is merely one example on the top gate-type polysilicon TFT exemplified in FIG. 2, so that a bottom gate-type TFT can be formed, or an amorphous silicon TFT, not the polysilicon TFT, can be formed using a different arbitrary method.

Figure 4B:
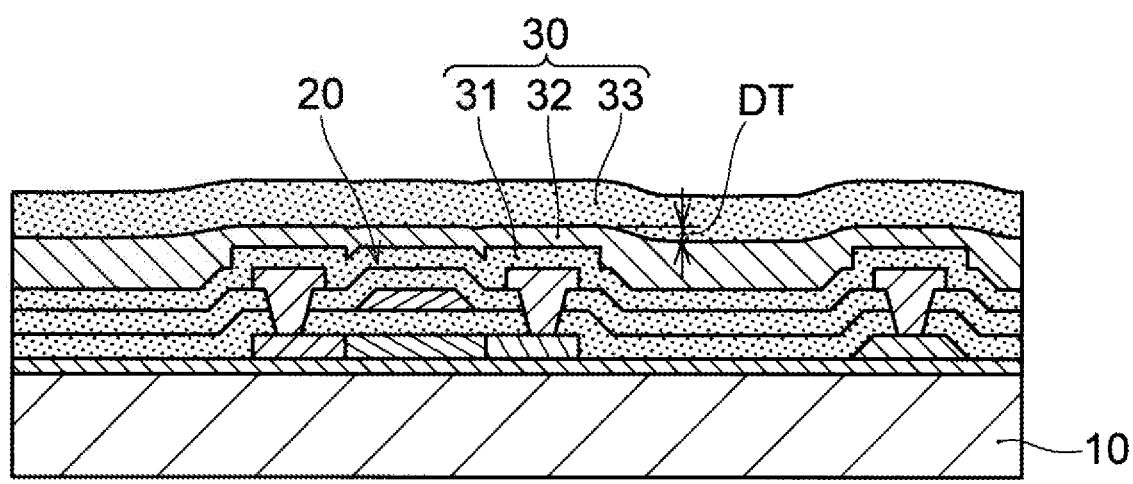
FIG. 4B schematically shows a cross sectional view of the organic-EL display apparatus in manufacturing using the method of manufacturing an organic-EL display apparatus according to one embodiment of the present invention.

Thereafter, as shown in FIG. 4B, a first inorganic insulating layer 31, an organic insulating layer 32, and a second inorganic insulating layer 33 are formed (S2 in FIG. 3) on the surface of the drive circuit 2 (see FIG. 4A). The first inorganic insulating layer 31 is formed by forming a layer of, for example, $SiN_x$ or $SiO_2$ having a thickness of approximately 200 nm using plasma CVD, for example. The first inorganic insulating layer 31 functions as a barrier layer to prevent a component of the organic insulating layer 32 from being in contact with the TFT 20. Moreover, the organic insulating layer 32 is formed by applying a liquid resin or a pasty resin of low viscosity to fill the unevenness due to formation of the TFT 20. When the liquid resin is used, the surface of the organic insulating layer 32 is easily planarized. While slit coating or spin coating is exemplified as a method of applying the liquid resin, the method thereof can be slit and spin coating in which both thereof are combined. The organic insulating layer 32 is formed so as to have a thickness of approximately 1 μm or more and 2 μm or less. As a material for the organic insulating layer 32, a polyimide resin or an acrylic resin can be used, for example. A photosensitive resin including an added photopolymerization initiator (a photosensitive body) such as Michler's ketone, Chlorothioxanthone, or Isopropylthioxanthone can be used. However, a non-photosensitive resin not comprising the photosensitive body is preferable in that it is high in purity and, even more, the surface smoothness of the organic insulating layer 32 is high. Particularly, the acrylic resin is preferable.

The second inorganic insulating layer 33 is formed by forming a layer consisting of, for example, $SiN_x$ or $SiO_2$ using plasma CVD, for example, in the same manner as forming the first inorganic insulating layer 31. Forming the second inorganic insulating layer 33 makes it possible to prevent penetration, into the organic insulating layer 32, of various solvents such as a cleaning agent that can be used in a post-process, and the possibly-resulting deterioration of the TFT 20.

The second inorganic insulating layer 33 is a layer to prevent the unevenness of the surface of the organic insulating layer 32 that can occur due to the unevenness of the surface of the substrate 10 from appearing at the surface of a planarizing layer 30 (the surface of the second inorganic insulating layer 33). Therefore, the second inorganic insulating layer 33 is preferably formed so as to have a thickness to be selected based on a maximum height difference DT of the unevenness of the surface of the organic insulating layer 32. For example, the second inorganic insulating layer 33 is formed so as to have a thickness of equal to or more than twice the maximum height difference DT of the unevenness of a surface of the organic insulating layer 32 facing to the second inorganic insulating layer 33. This makes it possible to ensure that a recess on the surface of the organic insulating layer 32 be filled by a part of the second inorganic insulating layer 33. Moreover, the second inorganic insulating layer 33 is more preferably formed so as to have a thickness of equal to or more than two times the maximum height difference DT and equal to or less than three times the maximum height difference DT of the unevenness of the surface of the organic insulating layer 32. This makes it possible to surely fill the recess of the organic insulating layer 32 as described previously. Moreover, in the below-described polishing process, it is possible, without unnecessarily thickening the second inorganic insulating layer 33, to certainly level the unevenness that is based on the unevenness of the organic insulating layer 32 and can appear on the surface of the second inorganic insulation layer 33 after formation thereof. Even more, it is possible to almost certainly prevent the organic insulating layer 32 from being exposed after the polishing.

Figure 4C:
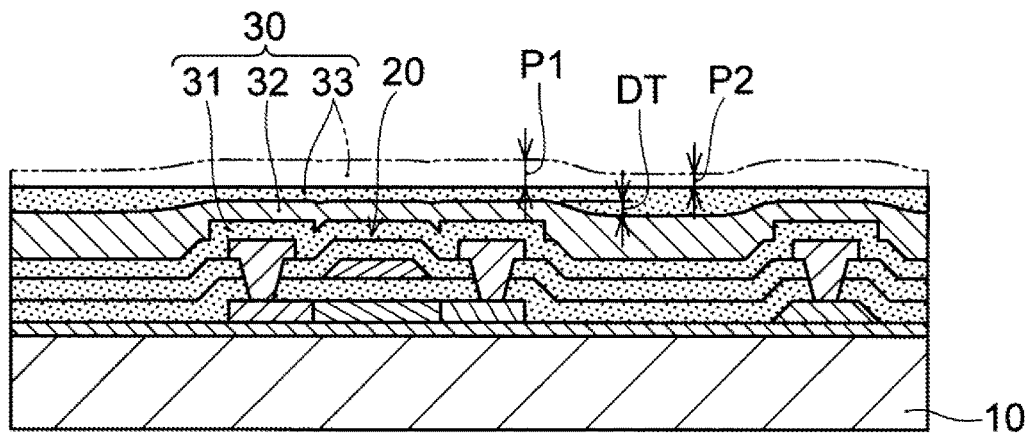
FIG. 4C schematically shows a cross sectional view of the organic-EL display apparatus in manufacturing using the method of manufacturing an organic-EL display apparatus according to one embodiment of the present invention.

Next, as shown in FIG. 4C, the surface of the second inorganic insulating layer 33 is polished (S3 in FIG. 3). It has been found by the present inventor that, as described previously, in a case that the surface of the planarizing layer 30 to be the base for an organic light-emitting element 40 (see FIG. 2) is not sufficiently planar, the display non-uniformity can be produced in the organic-EL display apparatus. Therefore, the surface of the second inorganic insulating layer 33 making up the surface of the planarizing layer 30 is polished. For example, the surface of the second inorganic insulating layer 33 is polished so as to have an arithmetic average roughness of 50 nm or less. As described previously, polishing the surface to the surface roughness of such a degree makes it possible to ensure that a display non-uniformity such as to be detected by a human being be seldom produced. Moreover, in planarization of the surface of the planarizing layer 30, the arithmetic average roughness such as to be set as a target in the semiconductor device manufacturing process, such as to be less than 20 nm, is not necessarily required. Rather, in order to avoid a complicated and time-consuming polishing process including an inspection of the surface roughness, the surface of the second inorganic insulating layer 33 is preferably polished so as to have an arithmetic average roughness of 20 nm or more and 50 nm or less.

In polishing of the surface of the second inorganic insulating layer 33, the second inorganic insulating layer 33 is polished such that the polishing amount (the amount of decrease in thickness of the second inorganic insulating layer 33 due to polishing) at least partially reaches an amount equal to or more than one times the maximum height difference DT and less than two times the maximum height difference DT of the unevenness of the surface of the organic insulating layer 32. In this way, in a case that the second inorganic insulating layer 33 is formed so as to have the thickness of equal to or more than twice the maximum height difference DT of the unevenness of the organic insulating layer 32 as described previously, unevenness that can appear on the surface of the second inorganic insulating layer 33 after formation thereof based on the unevenness of the organic insulating layer 32 can surely be leveled. Even more, it is possible to almost certainly prevent the exposure of the organic insulating layer 32 due to polishing. For example, in the example in FIG. 4C, a polishing amount P1 in a region (for example, a region in which the TFT 20 is formed) being a protrusion at the surface of the second inorganic insulating layer 33 after formation thereof is around twice the maximum height difference DT of the unevenness at the surface of the organic insulating layer 32. Moreover, in the example in FIG. 4C, a polishing amount P2 in a region (for example, a region in which the TFT 20 is not formed) being a recess at the surface of the second inorganic insulating layer 33 after formation thereof is an amount being substantially the same as but slightly below the maximum height difference DT of the unevenness of the organic insulating layer 32.

Method of polishing the second inorganic insulating layer 33 is not particularly limited. However, in order to achieve the arithmetic average roughness of 50 nm or less, polishing is preferably carried out by CMP (chemical mechanical polishing) in which a neutral slurry containing cerium, colloidal silica, or fumed silica is used as a polishing agent. The CMP makes it possible to increase the effect of mechanical polishing through surface chemical action which the polishing agent has, for example, and to rapidly obtain a smoothly polished surface. Cerium can be an effective polishing agent for the second inorganic insulating layer 33 being formed of $SiO_2$ since Cerium has high hardness and a Ceria ($CeO_2$) being an oxide of Cerium causes a chemical reaction with glass. Colloidal silica refers to a colloidal hydrated $SiO_2$ or colloidal $SiO_2$ normally having the particle diameter of 10 nm to 300 nm, while fumed silica (also called a dry silica or a highly-dispersed silica) refers to spherical $SiO_2$ particles having the particle diameter of 10 nm to 30 nm being aggregated (the particle diameter of 100 nm to 400 nm), and both thereof effectively function as polishing agents.

Moreover, for polishing of the second inorganic insulating layer 33, neutral aqueous alcohol or potassium hydroxide aqueous solution is used together with the previously-described polishing agent. In particular, in a case that the substrate 10 is formed of a polyimide resin, from a viewpoint of preventing corrosion of the substrate 10, the surface of the second inorganic insulating layer 33 is preferably polished using the neutral alcohol solution together with the previously-described polishing agent.

Figure 4D:
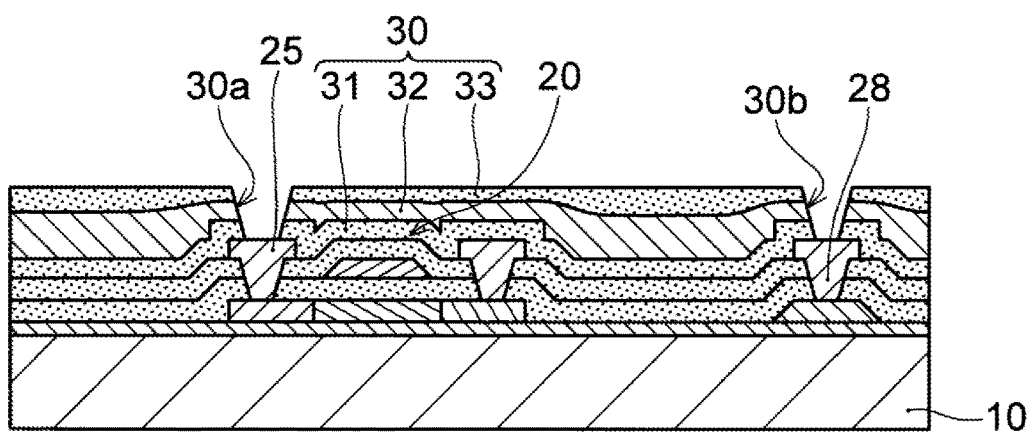
FIG. 4D schematically shows a cross sectional view of the organic-EL display apparatus in manufacturing using the method of manufacturing an organic-EL display apparatus according to one embodiment of the present invention.

As shown in FIG. 4D, a contact hole 30a is formed (S4 in FIG. 3) in the second inorganic insulating layer 33, the organic insulating layer 32, and the first inorganic insulating layer 31, so as to reach the drive circuit 2 (see FIG. 4A). Preferably, the contact hole 30a to collectively penetrate these three insulating layers is formed. The contact hole 30a is preferably formed at a region not overlapping, in the thickness direction of the substrate 10, with a region at which an organic light-emitting layer 43 (see FIG. 4F) is to be formed in a formation of the organic light-emitting layer 43 to be described below. This makes it possible to prevent the occurrence of display non-uniformity as described previously. In the same manner as the previously-described contact hole 24a, forming of the contact hole 30a is carried out using dry etching after a resist mask is formed, for example. In a case of forming a hole in a layer in which an inorganic film and an organic film co-exist as with the planarizing layer 30, using wet etching causes a stepped portion to be produced in the inner wall of the hole since the etching rates of both of the films differ from each other. In that case, the interior of the contact hole 30a is not completely filled with metal in the below-described process, making it likely to produce the problem of the contact resistance of the metal with the source electrode 25 increasing. However, by using dry etching, the contact hole 30a having an inner wall with the small stepped portions can be formed in the planarizing layer 30 in which the inorganic layer and the organic layer co-exist. At the time of forming the contact hole 30a, the contact hole 30b for the second contact 45 (see FIG. 2) is formed using the same method as the contact hole 30a also at a portion above the first contact 28 in the planarizing layer 30.

Figure 4E:
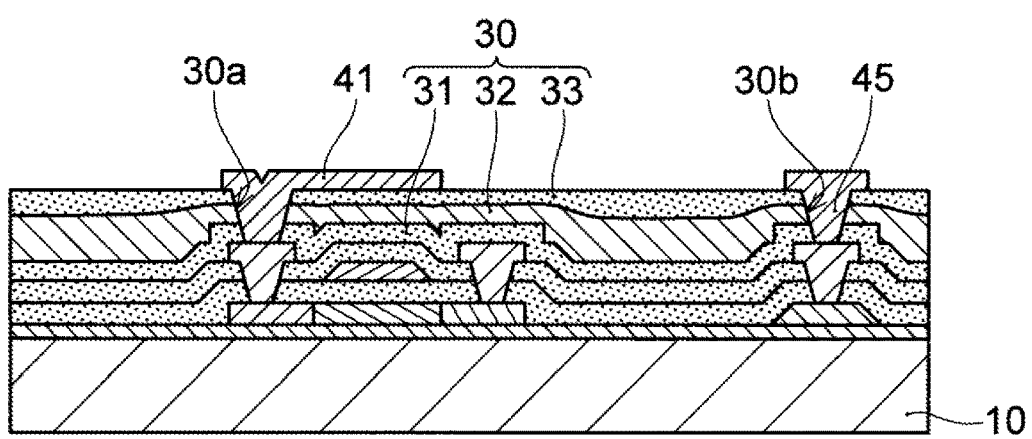
FIG. 4E schematically shows a cross sectional view of the organic-EL display apparatus in manufacturing using the method of manufacturing an organic-EL display apparatus according to one embodiment of the present invention.

As shown in FIG. 4E, a metal is embedded at the interior of the contact hole 30a and a first electrode 41 of the organic light-emitting element 40 (see FIG. 2) is formed in a given region (S5 of FIG. 3). More specifically, using sputtering, for example, an underlayer in which are deposited an ITO layer having a thickness of approximately 10 nm, and an Ag layer or an APC layer having a thickness of approximately 100 nm, and an overlayer mainly comprising an ITO layer having a thickness of approximately 10 nm are formed. As a result, a deposited layer consisting of the ITO layer, the Ag layer or the APC layer, and the ITO layer is formed on the surface of the planarizing layer 30 as well as the metal is embedded at the interior of the contact hole 30a. Thereafter, the deposited layer is patterned to form the first electrode 41. As shown in FIG. 4E, the deposited layer is preferably patterned such that the first electrode 41 has a region having a sufficient size with respect to forming of the organic light-emitting layer 43 and not overlapping with the contact hole 30a in planar view. At the time of embedding the metal into the contact hole 30a, the contact hole 30b is filled at least with the ITO layer, and the Ag layer or APC layer, so that the second contact 45 is formed.

Figure 4F:
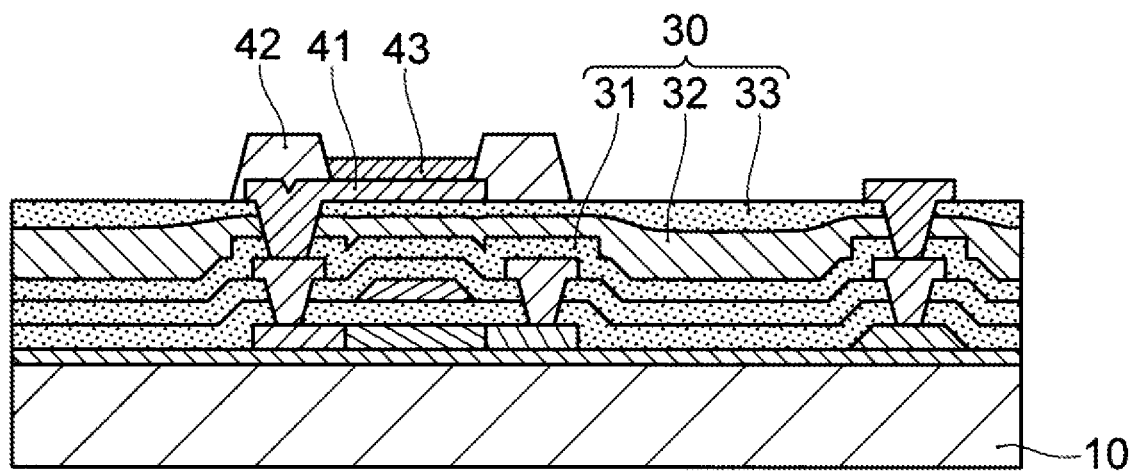
FIG. 4F schematically shows a cross sectional view of the organic-EL display apparatus in manufacturing using the method of manufacturing an organic-EL display apparatus according to one embodiment of the present invention.

As shown in FIG. 4F, the organic light-emitting layer 43 is formed on the first electrode 41 (S6 in FIG. 3). Specifically, an insulating bank 42 to prevent the first electrode 41 and a second electrode 44 (see FIG. 2) from being in contact with each other as well as to demarcate each pixel is formed at the peripheral edge of the first electrode 41. The insulating bank 42 can be an inorganic insulating layer such as $SiO_2$, or an organic insulating layer such as a polyimide resin or an acrylic resin. For example, such an insulating layer is formed on the entire surface of the first electrode 41 and the planarizing layer 30 and a given region of the first electrode 41 is exposed by the patterning the formed insulating layer. Preferably, a region of the first electrode 41, which does not overlap with the contact hole 30a in the thickness direction of the substrate 10 is exposed. The insulating bank 42 is formed so as to have a height of approximately 1 μm. As described previously, various organic materials are deposited in forming of the organic light-emitting layer 43. Deposition of the organic materials is carried out by vacuum vapor deposition, for example, in which case the organic material is vapor-deposited through a vapor-deposition mask having an aperture corresponding to a desired sub-pixel of R, G, or B. A layer such as LiF to improve the injectability of electrons can be formed on the surface of the organic light-emitting layer 43. The organic light-emitting layer 43 can be formed by inkjet printing, not vapor deposition.

Figure 4G:
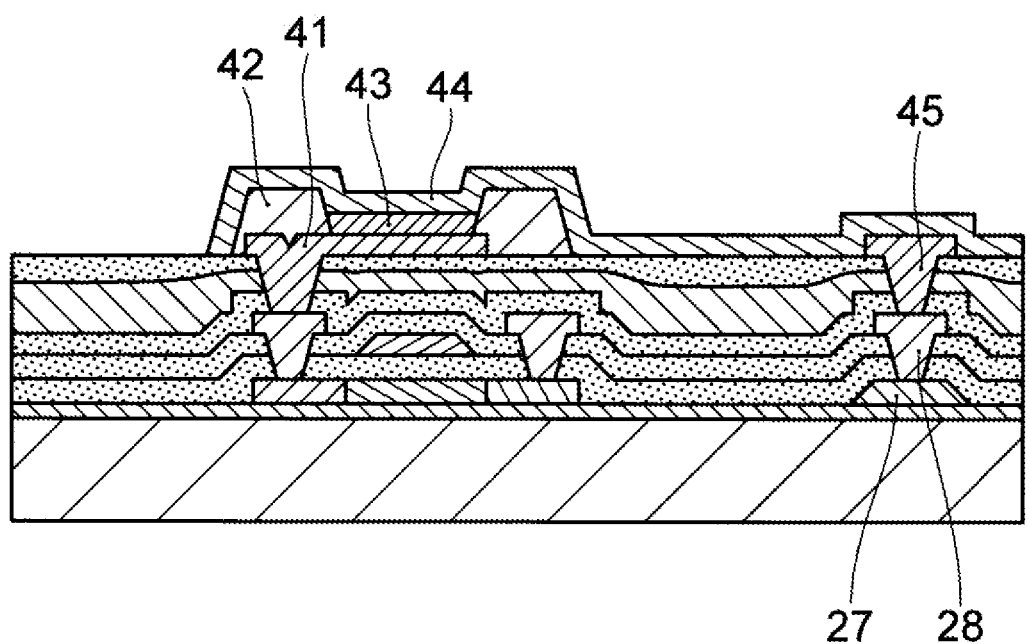
FIG. 4G schematically shows a cross sectional view of the organic-EL display apparatus in manufacturing using the method of manufacturing an organic-EL display apparatus according to one embodiment of the present invention.

As shown in FIG. 4G, the second electrode 44 is formed on the organic light-emitting layer 43 (S7 in FIG. 3). The second electrode 44 is formed by forming a thin-film of Mg—Ag eutectic film using co-vapor deposition, for example. The second electrode 44 is formed also on the second contact 45 and connected to the cathode wiring 27 via the second contact 45 and the first contact 28. The Mg—Ag eutectic film is an eutectic film of Mg and Ag evaporated or sublimed from different crucibles, as Mg and Ag have different melting points, to be eutecticized at the time of formation of the Mg—Ag eutectic film. The Mg—Ag eutectic film comprises Mg at approximately 90 mass % and Ag at approximately 10 mass %, for example. The second electrode 44 is formed so as to have the thickness of approximately 10 to 20 nm, for example.

An encapsulation layer 46 (see FIG. 2) to protect the second electrode 44 and the organic light-emitting layer 43 from, for example, moisture or oxygen is formed over the second electrode 44. The encapsulation layer 46 protects the second electrode 44 and the organic light-emitting layer 43 being susceptible to moisture or oxygen, so that the encapsulation layer 46 is formed by forming, using plasma CVD, an inorganic insulating layer such as $SiO_2$ or $SiN_x$ that is difficult to absorb moisture. The encapsulation layer 46 is preferably formed such that the end portion thereof comes into close contact with an inorganic layer such as the second inorganic insulating layer 33. This is because joining of the inorganic layers together causes them to be joined in close contact with each other. This makes it possible to more surely prevent penetration of moisture. The organic-EL display apparatus 1 shown in FIG. 2 can be manufactured by undergoing the above-described process.

SUMMARY (1) An organic-EL display apparatus according to first embodiment of the present invention comprises a substrate having a surface with a drive circuit being formed on the surface, the drive circuit comprising a thin-film transistor; a planarizing layer to planarize the surface of the substrate by covering the drive circuit; and an organic light-emitting element being formed on a surface of the planarizing layer and electrically connected to the drive circuit, wherein the planarizing layer comprises a first inorganic insulating layer being deposited on the drive circuit; an organic insulating layer being deposited on the first inorganic insulating layer; and a second inorganic insulating layer being deposited on the organic insulating layer, and a surface of the second inorganic insulating layer facing to an opposite orientation from the organic insulating layer has an arithmetic average roughness of 50 nm or less.

The configuration according to (1) makes it possible to reduce the luminance non-uniformity or color non-uniformity in an organic-EL display apparatus.

(2) In the organic-EL display apparatus according to (1), the surface of the second inorganic insulating layer can have an arithmetic average roughness of 20 nm or more and 50 nm or less. In that case, it can be easily achieved to cope with both easy manufacture and effective suppression of the display non-uniformity that can influence the display quality.

(3) In the organic-EL display apparatus according to (1) or (2), the organic insulating layer can be an acrylic resin not comprising a photosensitive body, or a polyimide resin not comprising the photosensitive body. In that case, an organic insulating layer being high in planarity of the surface is easily obtained, and a planarizing layer having a surface with the arithmetic average roughness of 50 nm or less is easily obtained.

(4) In the organic-EL display apparatus according to any one of (1) to (3), a surface of the organic insulating layer facing to the second inorganic insulating layer can have an arithmetic average roughness of 100 nm or more and 300 nm or less. In that case, the planarizing layer having a surface with the average surface roughness of 50 nm or less can be easily formed, and, the content rate of the leveling improving agent in the organic insulating layer can be kept to a degree so as not to be excessive.

(5) In the organic-EL display apparatus according to (4), the organic insulating layer can comprise an additive agent at a content rate of 0.5 mass % or more and 5 mass % or less, wherein the additive agent improves a planarity of the surface of the organic insulating layer. In that case, the planarizing layer having a surface with the arithmetic average roughness of 50 nm or less is easily formed and, even more, the property required for a resin material making up the organic insulating layer is seldom affected.

(6) In the organic-EL display apparatus according to any one of (1) to (5), the drive circuit and the organic light-emitting element can be connected via a metal being embedded in a contact hole collectively penetrating the first inorganic insulating layer, the organic insulating layer, and the second inorganic insulating layer. In that case, the drive circuit and the organic light-emitting element are surely connected through a path having good conductivity.

(7) In the organic-EL display apparatus in any one of (1) to (6), the thickness of the second inorganic insulating layer can vary based on an unevenness of a surface of the organic insulating layer facing to the second inorganic insulating layer, and the thickness of the second inorganic insulating layer can be equal to or more than one times a maximum height difference of the unevenness and equal to or less than three times the maximum height difference of unevenness over an entirety of the surface of the organic insulating layer. In that case, the organic insulating layer is never exposed, and the unevenness of the surface of the organic insulating layer can be leveled at the surface of the planarizing layer.

(8) A method of manufacturing an organic-EL display apparatus according to second embodiment of the present invention comprises: forming a drive circuit on a substrate, the drive circuit comprising a thin-film transistor; forming, on a surface of the drive circuit, a first inorganic insulating layer, an organic insulating layer, and a second inorganic insulating layer; polishing a surface of the second inorganic insulating layer; forming a contact hole in the second inorganic insulating layer, the organic insulating layer, and the first inorganic insulating layer, so as to reach the drive circuit; embedding a metal at the interior of the contact hole and forming a first electrode at a given region; forming an organic light-emitting layer on the first electrode; and forming a second electrode on the organic light-emitting layer.

The configuration according to (8) makes it possible to appropriately manufacture an organic-EL display apparatus having a small luminance non-uniformity or color non-uniformity.

(9) In the method of manufacturing an organic-EL display apparatus according to (8), in polishing of the surface of the second inorganic insulating layer, the surface of the second inorganic insulating layer can be polished so as to have an arithmetic average roughness of 50 nm or less by chemical mechanical polishing using, as a polishing agent, a neutral slurry containing cerium, colloidal silica, or fumed silica. In this way, the surface of the planarizing layer can be rapidly polished so as to have the surface roughness to such a degree as generally not cause the display non-uniformity to occur.

(10) In the method of manufacturing an organic-EL display apparatus according to (9), in polishing of the surface of the second inorganic insulating layer, the surface of the second inorganic insulating layer can be polished so as to have an arithmetic average roughness of 20 nm or more and 50 nm or less. In this way, the surface roughness of the planarizing layer in such a degree as almost certainly not to produce the display non-uniformity can be obtained and, even more, a complicated time-consuming polishing process can be avoided.

(11) In the method of manufacturing an organic-EL display apparatus according to (9) or (10), in polishing of the surface of the second inorganic insulating layer, the surface of the second inorganic insulating layer can be polished using a neutral alcohol solution together with the polishing agent. In this way, even in a case that a resin such as polyimide is used for the substrate, corrosion thereof can be prevented.

(12) In the method of manufacturing an organic-EL display apparatus according to any one of (8) to (11), in forming of the second inorganic insulating layer, the second inorganic insulating layer can be formed so as to have a thickness of equal to or more than twice a maximum height difference of an unevenness of a surface of the organic insulating layer facing to the second inorganic insulating layer; and, in polishing of the surface of the second inorganic insulating layer, the second inorganic insulating layer can be polished such that an amount of decrease in thickness of the second inorganic insulating layer due to the polishing reaches, at least partially, an amount equal to or more than one times the maximum height difference and less than two times the maximum height difference. In this way, the unevenness that can appear on the surface of the second inorganic insulating layer after formation thereof based the unevenness of the organic insulating layer can surely be leveled, and, even more, exposure of the organic insulating layer due to polishing can surely be prevented.

(13) In the method of manufacturing an organic-EL display apparatus according to (12), in forming of the second inorganic insulating layer, the second inorganic insulating layer can be formed so as to have a thickness of equal to or more than two times the maximum height difference and equal to or less than three times the maximum height difference. In this way, a recess in the organic insulating layer can surely be filled without unnecessarily thickening the second inorganic insulating layer.

(14) In the method of manufacturing an organic-EL display apparatus according to any one of (8) to (13), forming of the contact hole can be carried out by dry etching. In this way, a stepped portion is unlikely to be produced on the inner wall of the contact hole, making it possible to prevent an increase in contact resistance between the organic light-emitting element and the drive circuit.

(15) In the method of manufacturing an organic-EL display apparatus according to any one of (8) to (14), the contact hole can be formed at a region not overlapping with a certain region in a thickness direction of the substrate, the certain region is a region at which the organic light-emitting layer is to be formed. This makes it possible to prevent a recess being produced on a surface of the organic light-emitting layer and a decrease in the display quality.

DESCRIPTION OF REFERENCE NUMERALS

1 Organic-EL display apparatus
2 Drive circuit
3 Organic-EL display panel
10 Substrate
20 Thin-film transistor (drive TFT, TFT)
23 Gate electrode
25 Source electrode
26 Drain electrode
30 Planarizing layer
30a, 30b Contact hole
31 First inorganic insulating layer
32 Organic insulating layer
33 Second inorganic insulating layer
40 Organic light-emitting element (OLED)
41 First electrode
43 Organic light-emitting layer
44 Second electrode

The invention claimed is:
1. An organic-EL display apparatus, comprising:
a substrate having a surface with a drive circuit being formed on the surface, the drive circuit comprising a thin-film transistor;
a planarizing layer to planarize the surface of the substrate by covering the drive circuit; and
an organic light-emitting element being formed on a surface of the planarizing layer and electrically connected to the drive circuit, wherein the planarizing layer comprises a first inorganic insulating layer being deposited on the drive circuit; an organic insulating layer being deposited on the first inorganic insulating layer; and a second inorganic insulating layer being deposited on the organic insulating layer, a surface of the second inorganic insulating layer facing to an opposite orientation from the organic insulating layer has an arithmetic average roughness of 20 nm or more and 50 nm or less, and a surface of the organic insulating layer facing to the second inorganic insulating layer has an arithmetic average roughness of 100 nm or more and 300 nm or less.

2. The organic-EL display apparatus according to claim 1, wherein the organic insulating layer comprises an additive agent at a content rate of 0.5 mass % or more and 5 mass % or less, wherein the additive agent improves a planarity of the surface of the organic insulating layer.

3. The organic-EL display apparatus according to claim 1, wherein the drive circuit and the organic light-emitting element are connected via a metal being embedded in a contact hole collectively penetrating the first inorganic insulating layer, the organic insulating layer, and the second inorganic insulating layer.

4. A method of manufacturing the organic-EL display apparatus according to claim 1, the method comprising:
    forming a drive circuit on a substrate, the drive circuit comprising a thin-film transistor;
    forming, on a surface of the drive circuit, a first inorganic insulating layer, an organic insulating layer, and a second inorganic insulating layer;
    polishing a surface of the second inorganic insulating layer;
    forming a contact hole in the second inorganic insulating layer, the organic insulating layer, and the first inorganic insulating layer, so as to reach the drive circuit;
    embedding a metal at an interior of the contact hole and forming a first electrode at a given region;
    forming an organic light-emitting layer on the first electrode; and
    forming a second electrode on the organic light-emitting layer, wherein
    in polishing of the surface of the second inorganic insulating layer, the surface of the second inorganic insulating layer is polished so as to have an arithmetic average roughness of 50 nm or less by chemical mechanical polishing using, as a polishing agent, a neutral slurry containing cerium, colloidal silica, or fumed silica, and
    in polishing of the surface of the second inorganic insulating layer, the surface of the second inorganic insulating layer is polished so as to have an arithmetic average roughness of 20 nm or more and 50 nm or less.

5. The method of manufacturing the organic-EL display apparatus according to claim 4, wherein, in polishing of the surface of the second inorganic insulating layer, the surface of the second inorganic insulating layer is polished using a neutral alcohol solution together with the polishing agent.

6. The method of manufacturing the organic-EL display apparatus according to claim 4, wherein,
    in forming of the second inorganic insulating layer, the second inorganic insulating layer is formed so as to have a thickness of equal to or more than twice a maximum height difference of an unevenness of a surface of the organic insulating layer facing to the second inorganic insulating layer, and
    in polishing of the surface of the second inorganic insulating layer, the second inorganic insulating layer is polished such that an amount of decrease in thickness of the second inorganic insulating layer due to the polishing reaches, at least partially, an amount equal to or more than one times the maximum height difference and less than two times the maximum height difference.

7. The method of manufacturing the organic-EL display apparatus according to claim 6, wherein, in forming of the second inorganic insulating layer, the second inorganic insulating layer is formed so as to have a thickness of equal to or more than two times the maximum height difference and equal to or less than three times the maximum height difference.

8. The method of manufacturing the organic-EL display apparatus according to claim 4, wherein forming of the contact hole is carried out by dry etching.

9. The method of manufacturing the organic-EL display apparatus according to claim 4, wherein the contact hole is formed at a region not overlapping with a certain region in a thickness direction of the substrate, the certain region is a region at which the organic light-emitting layer is to be formed.

10. An organic-EL display apparatus, comprising:
    a substrate having a surface with a drive circuit being formed on the surface, the drive circuit comprising a thin-film transistor;
    a planarizing layer to planarize the surface of the substrate by covering the drive circuit; and
    an organic light-emitting element being formed on a surface of the planarizing layer and electrically connected to the drive circuit, wherein
    the planarizing layer comprises a first inorganic insulating layer being deposited on the drive circuit; an organic insulating layer being deposited on the first inorganic insulating layer; and a second inorganic insulating layer being deposited on the organic insulating layer,
    a surface of the second inorganic insulating layer facing to an opposite orientation from the organic insulating layer has an arithmetic average roughness of 20 nm or more and 50 nm or less,
    a thickness of the second inorganic insulating layer varies based on an unevenness of a surface of the organic insulating layer facing to the second inorganic insulating layer, and
    the thickness of the second inorganic insulating layer is equal to or more than one times a maximum height difference of the unevenness and equal to or less than three times the maximum height difference of the unevenness over an entirety of the surface of the organic insulating layer.

* * * * *